(12) United States Patent
Yamauchi et al.

(10) Patent No.: US 7,918,953 B2
(45) Date of Patent: Apr. 5, 2011

(54) ALIGNMENT METHOD AND MOUNTING METHOD USING THE ALIGNMENT METHOD

(75) Inventors: Akira Yamauchi, Shiga (JP); Mikio Kawakami, Shiga (JP)

(73) Assignee: Toray Engineering Co., Ltd., Osaka-shi (JP)

( * ) Notice: Subject to any disclaimer, the term of this patent is extended or adjusted under 35 U.S.C. 154(b) by 579 days.

(21) Appl. No.: 11/979,595

(22) Filed: Nov. 6, 2007

(65) Prior Publication Data

US 2008/0073027 A1     Mar. 27, 2008

Related U.S. Application Data

(62) Division of application No. 10/509,882, filed as application No. PCT/JP03/03880 on Mar. 27, 2003, now Pat. No. 7,299,545.

(30) Foreign Application Priority Data

Apr. 4, 2002   (JP) .................................. 2002-102561

(51) Int. Cl.
  *B32B 41/00*     (2006.01)
  *H05K 13/04*    (2006.01)
  *H05K 13/00*    (2006.01)
(52) U.S. Cl. ................. 156/64; 29/833; 29/832; 29/834; 29/836; 29/739; 702/95

(58) Field of Classification Search ................. 156/64, 156/351, 362, 378; 702/95; 29/734, 740, 29/741, 742, 743, 833, 834, 835, 836, 837, 29/838, 839, 840, 841
See application file for complete search history.

(56) References Cited

U.S. PATENT DOCUMENTS

| | | | |
|---|---|---|---|
| 4,980,971 A | 1/1991 | Bartschat et al. | |
| 5,177,864 A | 1/1993 | Oyama | |
| 6,762,848 B2 | 7/2004 | Hayata et al. | |
| 6,892,447 B1 | 5/2005 | Yamauchi et al. | |
| 7,176,967 B1 | 2/2007 | Dykaar et al. | |
| 2002/0138974 A1 | 10/2002 | Suhara et al. | |
| 2004/0026006 A1 | 2/2004 | Arai et al. | |

FOREIGN PATENT DOCUMENTS

| | | | |
|---|---|---|---|
| JP | 61-275609 A | | 12/1986 |
| JP | 8-8591 A | | 1/1996 |
| JP | 2001-217596 A | | 8/2001 |
| WO | WO 02/25720 | * | 2/2002 |

* cited by examiner

*Primary Examiner* — George R Koch, III
(74) *Attorney, Agent, or Firm* — Smith Patent Office

(57) ABSTRACT

Positioning recognition marks are read by movable recognition device for positioning objects to be bonded to each other. An alignment method includes a step of reading the recognition marks during movement of the recognition device before its complete stop, and a step of identifying absolute positions of the recognition marks by correcting the mark recognition positions having been read based on a position feedback signal of the moving recognition device. A mounting method using the alignment method is also disclosed. It is possible to maintain a high alignment accuracy, eliminate necessity of assuring a settling time for complete stop of the movable recognition device, and significantly reduce the alignment time and mounting tact.

20 Claims, 10 Drawing Sheets

(A)

(B)

ALIGNMENT METHOD AND MOUNTING METHOD USING THE ALIGNMENT METHOD

CROSS REFERENCE TO RELATED APPLICATIONS

This application is a divisional application of U.S. patent application Ser. No. 10/509,882 filed on Oct. 4, 2004, now U.S. Pat. No. 7,299,545 B2, which was the National Stage of International Application No. PCT/JP03/03880, filed on Mar. 27, 2003. The disclosures of U.S. patent application Ser. No. 10/509,882 and International Application No. PCT/JP03/03880 are hereby incorporated by reference.

BACKGROUND OF THE INVENTION

1. Field of the Invention

The present invention relates to an alignment method for positioning objects to be bonded to each other and a mounting method using the alignment method.

2. Discussion of the Related Art

For bonding objects to each other, for example, for bonding a chip to a substrate, relative positions between both objects have to be aligned at a high accuracy. For this alignment, recognition marks for positioning are provided on at least one object, usually, on both objects, the positions of the recognition marks are read by recognition means such as a camera and the recognition marks are positioned to each other, and whereby, the relative relationship in position between both objects is set within a predetermined accuracy.

In such an alignment, for example, in a case where an object is relatively large, recognition marks provided on both end portions thereof and the like are read by moving the recognition means, and based on the reading information, both objects are positioned to each other.

As shown in FIG. 1 for example, a two-sight recognition means 5 having sights in upward and downward directions is inserted between a first object 2 (for example, a chip) held on a head 1 and a second object 4 (for example, a substrate) held on a stage 3. The two-sight recognition means 5 has a two-sight optical system, for example, on an almost identical vertical axis. After a recognition mark A on first object 2 and a recognition mark C on second object 4 are read by moving two-sight recognition means 5, a recognition mark B on first object 2 and a recognition mark D on second object 4 are read by moving two-sight recognition means 5. Based on the reading information, for example, the position and posture of stage 3 are adjusted, thereby setting the relative positional accuracy between both objects within a predetermined accuracy.

In a conventional technology in such an alignment, when upper and lower recognition marks A, C (or B, D) are read, for example, as shown in FIG. 2, after two-sight recognition means 5 is moved to a predetermined reading position P1, a settling time T for complete stop of the recognition means 5 is assured, and the reading accuracy is assured by reading the marks after the complete stop after the settling time T.

However, if the settling time T is assured as described above, because at least about 0.1 to 1 second is taken for the settling time T, there is a limit for shortening the time up to the completion of the alignment, ultimately, a mounting tact for mounting the objects.

Further, if the recognition mark is read at an incomplete stop condition of the object, as shown in FIG. 3 for example, the recognition mark read during the movement may be recognized as a mark F enlarged by being extended in the movement direction X ascribed to the influence of the movement speed, as compared with a positioning recognition mark E recorded at a complete stop condition. In reading of the positioning recognition mark E, this phenomenon occurs, for example, when a shutter speed is set at about $1/100$ second or more. If recognized under the condition of mark F thus enlarged based on the recorded recognition mark E, the accuracy for the position recognition reduces.

SUMMARY OF THE INVENTION

Accordingly, an object of the present invention is to provide an alignment method which can maintain a high alignment accuracy and which can greatly shorten alignment time and mounting tact by eliminating the necessity for assuring a settling time as described above, and a mounting method using the alignment method.

Another object of the present invention is to prevent reduction of accuracy for recognizing positions of recognition marks, while achieving shortening of alignment time and mounting tact.

To accomplish the above objects, an alignment method according to the present invention for positioning objects to be bonded to each other by reading a positioning recognition mark provided on at least one object by movable recognition means, comprises the steps of reading the recognition mark during movement of the recognition means before its complete stop; and identifying an absolute position of the recognition mark by correcting a mark recognition position having been read by the recognition means, based on a position feedback signal of the recognition means sent during movement of the recognition means (a first alignment method). Namely, even if the recognition mark is read during movement of the recognition means before its complete stop, as long as the position feedback signal of the recognition means during its movement, that is, a coordinate of a moving axis at the time of mark reading, is precisely fed back, by correcting the mark position at the time of mark reading based on the feedback signal, an absolute position of the recognition mark at that time can be identified accurately. Because reading during movement becomes possible, it becomes unnecessary to assure a settling time before complete stop as required in a conventional technology, the alignment time, ultimately, the time for mounting, can be shortened greatly.

Further, the present invention also provides a basic technical concept to read both recognition marks simultaneously and synchronously, from the viewpoint of increasing an alignment accuracy as well as greatly shortening the alignment time, ultimately, the mounting time. Namely, an alignment method according to the present invention for positioning objects to be bonded to each other by reading positioning recognition marks provided on both objects by a two-sight recognition means having sights in directions toward both objects, comprises a step of reading both of the recognition marks simultaneously and synchronously with each other (a second alignment method). By thus reading both of the recognition marks provided on both objects simultaneously and synchronously using a two-sight recognition means, even if the two-sight optical system vibrates by the movement and there is an error between the read information and the coordinate of the moving axis to be taken, the relative positional relationship between the upper and lower recognition marks can be maintained because they are read synchronously, the alignment accuracy increases as compared with a conventional method wherein an accuracy of axis stopping is added to an alignment accuracy.

Therefore, even in the above-described first alignment method according to the present invention, it is preferred that a recognition means having sights in directions toward both objects, for example, a two-sight recognition means, is used as the movable recognition means, respective positioning recognition marks provided on both objects are simultaneously read synchronously as to respective sights during movement of the recognition means before its complete stop, and absolute positions of respective recognition marks are identified by correcting respective mark recognition positions having been read by the recognition means, based on position feedback signals of the recognition means sent during movement of the recognition means. Because the absolute positions can be identified, it becomes also possible to carry out a correction in a rotational direction (θ direction). By this, because the reading accuracy is high and the absolute positions of the marks can be recognized, a further high accuracy alignment becomes possible, and shortening of mounting time becomes possible.

Further, in the above-described first alignment method according to the present invention, a method may be also employed wherein recognition means for reading all of the respective positioning recognition marks provided on both objects from lower side is used as the above-described movable recognition means, respective recognition marks are read during movement of the recognition means before its complete stop, and absolute positions of respective recognition marks are identified by correcting respective mark recognition positions having been read by the recognition means, based on position feedback signals of the recognition means sent during movement of the recognition means. A double lens camera can also be used as this movable recognition means disposed at a lower-side position. As such a double lens camera, a camera incorporated integrally into a movement mechanism of the camera, namely, incorporated integrally at a constant positional relationship can be used. Alternatively, the double lens camera may be constructed by incorporating two cameras being separable into a movement mechanism. Further, a method can also be employed wherein a positioning recognition mark provided on at least one object is read by transmitting a measurement wave (for example, a visual ray or an infrared ray) through an object or/and a member for receiving the object. The object or the member for receiving the object capable of transmitting a measurement wave is formed, for example, from a glass.

In the above-described first alignment method, it is preferred that the reading is carried out by software revision of an aberration of a lens of the movable recognition means. In a case where a camera mechanism having a lens is used as the movable recognition means, if merely read before a complete stop during movement, because there occurs a case where the mark is read at a time when the mark has not yet reached the center of the camera, when there is an aberration or distortion of a lens, it causes an error in recognition of a position. Therefore, if the distortion of the lens is corrected, for example, by storing a reference matrix mark in a software matrix, even in reading at a position other than the lens center, it becomes possible to recognize an accurate position and to prevent an obstacle to improve the accuracy.

In the above-described first and second alignment methods, a method can be employed wherein, when recognition marks of both objects are provided at positions impossible to read simultaneously, a recognition mark provided on one object is moved together with the object to a position at which the recognition mark can be read simultaneously with a recognition mark provided on the other object, and after both recognition marks are simultaneously read synchronously, an absolute position of the moved recognition mark is identified by correction in consideration of an amount of the movement.

In this method, it is preferred that, when the object is moved to the position possible to be read simultaneously, the object reaches a recognition position prior to the movable recognition means, or the object reaches a recognition position simultaneously with the movable recognition means. Further, it is preferred that, when the object is moved to the position possible to be read simultaneously, an absolute position of the recognition mark of the object is identified before a complete stop of a table for moving the object, based on a position feedback signal of the table.

Namely, when the recognition means is stopped, the means is hunting during a settling time. Further, even if the table is stopped, because a structural material may bend and vibrate, the recognition accuracy of the absolute position may be influenced. Therefore, if it is during movement at a constant speed rather than being stopped, no vibration occurs, and as long as only the position feedback signal can be precisely recognized, the recognition accuracy of the absolute position increases. Further, in a case where the object is moved to the position possible to be read simultaneously, the movement of the object must be completed before the recognition means reaches the position, where it is possible to be read simultaneously. If the movement of the object is late, it is necessary that the recognition means stops and waits. If so, a vibration may occur as described above and the recognition accuracy of the absolute position may be influenced. Therefore, the movement timing and the movement speed of the recognition means are adjusted beforehand, so that the object is reached prior to the recognition means. Further, a condition, where during the movement of the object, the recognition means is also during movement, and they cross just at a reading position, can realize a timing capable of measuring at a best condition in vibration. If such a condition is calculated beforehand and the movement timing and the movement speed are set beforehand, it becomes possible to always recognize at an optimum condition.

Further, in the above-described first and second alignment methods, when the recognition mark is read using the recognition means during its movement, in order to prevent reduction of position recognition accuracy by the enlargement of the recognition mark in the movement direction due to influence of movement speed as shown in FIG. 3, it is preferred to shorten an exposure time of a shutter of the recognition means. For example, using an electronic shutter, the exposure time thereof is set at $1/100$ second or less, preferably at $1/1000$ second or less, whereby it becomes possible to prevent the above-described mark enlarging recognition. However, if the exposure time of the electronic shutter is set at $1/1000$ second or less for example, the image becomes dark because of a lack of an amount of light. Although it is considered to use a strong light source in order to increase the amount of light, if the light of such a strong light source is used, for example, as shown in FIG. 4, when a recognition mark G is read, smear phenomenon may occur such that lines H trailed by a strong ray appear, and there is a fear that the position recognition accuracy is reduced by this smear phenomenon. Accordingly, in order to suppress the influence of this smear phenomenon to as little as possible, it is possible to substantially extinguish the lines H due to smear phenomenon by using a stroboscopic emission carried out synchronously with the exposure time due to the electronic shutter together with the electronic shutter, thereby preventing the reduction of the position recognition accuracy.

A mounting method according to the present invention comprises a method for using the above-described first or second alignment method, after positioning both objects, mounting one object onto the other object. Since it is not necessary to assure a settling time and the alignment time is shortened, it becomes possible to shorten the mounting tact greatly.

The above-described one object comprises, for example, a chip, and the other object comprises, for example, a substrate. In the present invention, however, the "chip" means all objects with forms being bonded to a substrate regardless of the kind and size, such as an IC chip, a semiconductor chip, an optoelectronic element, a surface mounting part and a wafer. Further, the "substrate" means all objects with forms being bonded to a chip regardless of the kind and size, such as a resin substrate, a glass substrate, a film substrate, a chip and a wafer.

Further, as the recognition means in the present invention, although, for example, a two-sight recognition means having sights in both directions toward upper and lower sides, and a recognition means inserted into a position of a lower side of both objects (including a double-lens camera), can be used, as its form, any type of recognition means can be employed as long as the recognition mark can be recognized, such as a CCD camera, an infrared ray camera, an X-ray camera, sensors, etc.

DETAILED DESCRIPTION OF THE PREFERRED EMBODIMENTS

Hereinafter, desirable embodiments of the present invention will be explained referring to figures.

Figure 1:
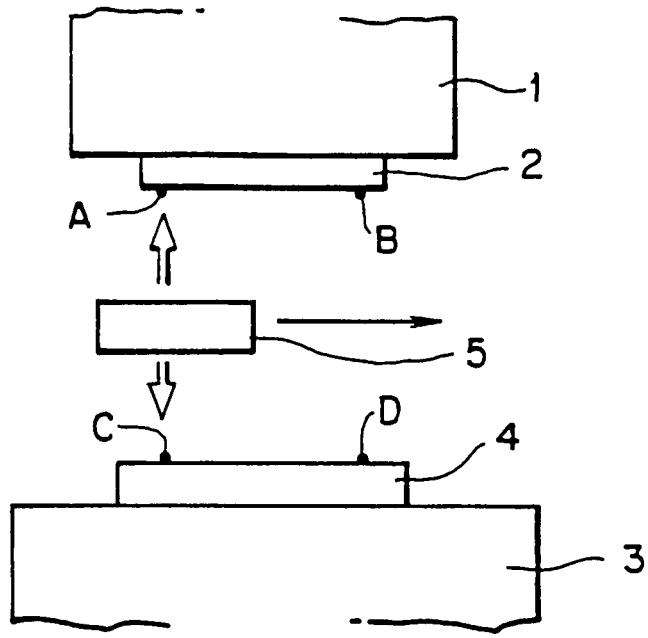
FIG. 1 is a schematic view of a mounting apparatus to which an alignment method according to an embodiment of the present invention can be applied.
Figure 2:
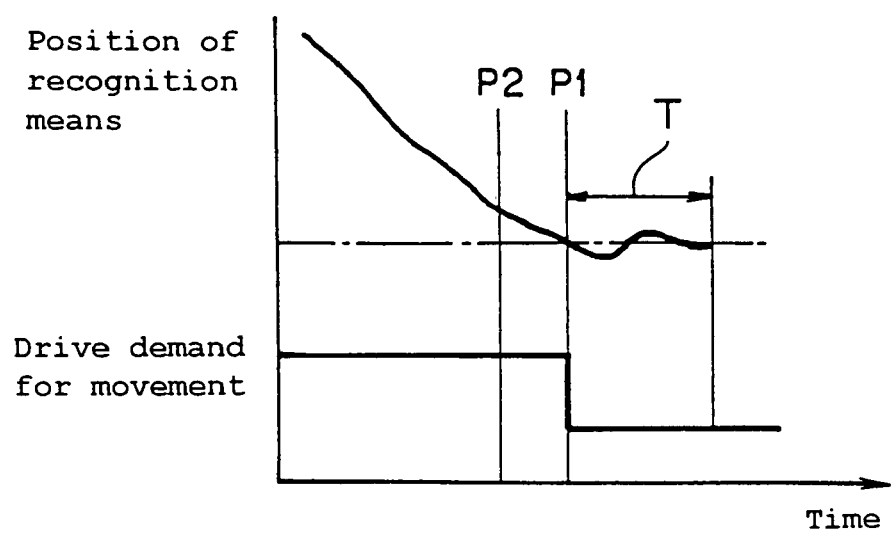
FIG. 2 is a diagram showing a settling time of a movable recognition means in a conventional technology and an example of mark recognition timing according to the method of the present invention.

As a mechanical constitution of an apparatus in the present invention, an apparatus similar to that shown in FIG. 1 can be used. In the present invention, as shown in FIG. 2, although a drive demand for the movement of recognition means 5 (a two-sight recognition means) is issued, without setting settling time T up to a complete stop as that in a conventional technology, recognition marks A, C (or B, D) are read during the movement, the reading is carried out, for example, at a point P2 shown in FIG. 2.

Figure 5:
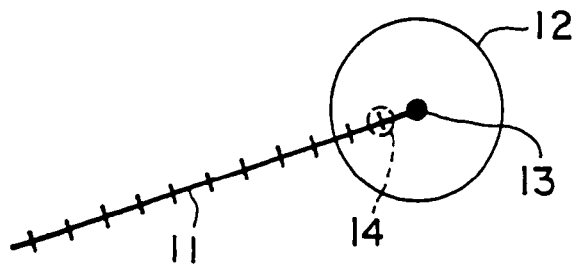
FIG. 5 is an explanation diagram showing an example of relationship between a movement axis and a sight in a movable recognition means.

This position of point P2 for reading may be present within a range in which an image of a recognition mark can be read. For example, as shown in FIG. 5, if a sight 12 of the recognition means (a center of the sight) comes to a position 14, at which an image of recognition mark 13 can be read, relative to a movement axis coordinate 11 of the recognition during movement due to an encoder or a magnetic scale provided in a recognition means movement mechanism or a recognition means position detection mechanism, the reading can be started.

Figure 6:
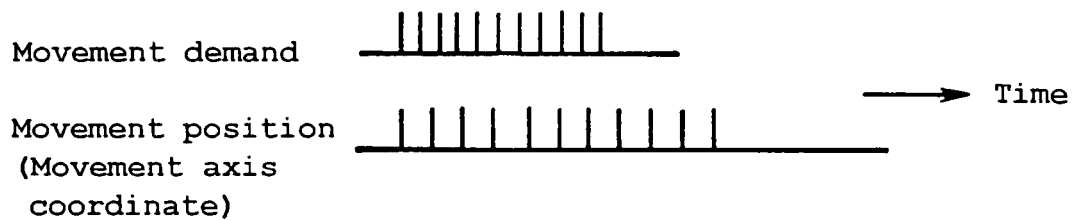
FIG. 6 is an explanation diagram showing an example of relationship between a movement demand and a coordinate of a movement axis in a movable recognition means.

At that time, as shown in FIG. 6, even if the movement demand and the movement position (movement axis coordinate) are shifted from each other as to a time axis, as long as only the position on the movement axis coordinate at the time of image reading can be fed back accurately, it is possible to correct the read position of the recognition mark at the reading precisely to an actual absolute position of the recognition mark, based on the feedback signal. By such a correction, regardless of the reading during movement, the absolute position of each recognition mark can be identified at a high accuracy, and based on the result of the correction, objects can be positioned to each other.

In particular, as shown in FIG. 1, if reading upper and lower recognition marks A, C (or B, D) simultaneously and synchronously by two-sight recognition means 5 having a two-sight optical system on almost the same axis, without being affected by a vibration and the like during movement, the positional relationship between upper and lower recognition marks can be recognized at a high accuracy, and based on this, a high-accuracy alignment can be carried out.

Figure 7:
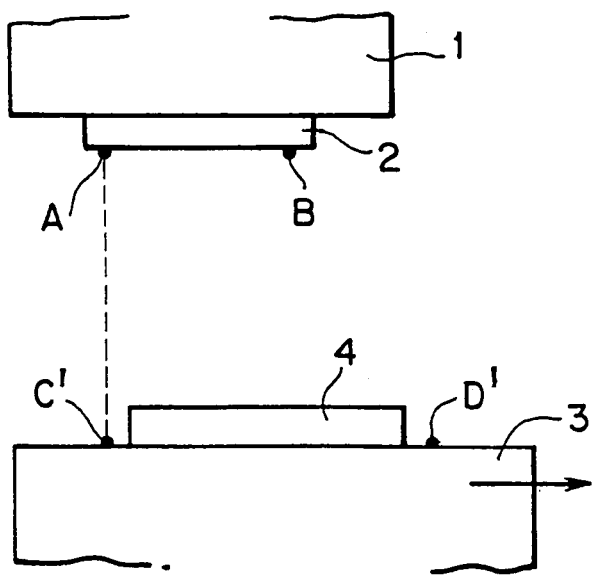
FIG. 7 is a schematic view of a mounting apparatus showing an example of a case where upper and lower marks are recognized by shifting a position of one recognition mark in the present invention.

In a case where upper and lower recognition marks cannot be read simultaneously as they are, for example, in a case where an adhesive or a film is provided on one object side and a recognition mark is provided at a position outside of the object, it becomes possible to read both of the upper and lower recognition marks simultaneously by shifting a position of the recognition mark of one object by a predetermined amount together with the object. Because this forcible shifting amount is a known amount, it can be easily and precisely corrected when both objects are positioned to each other. For example, as shown in FIG. 7, the position of second object 4 is forcibly shifted by moving stage 3 so that recognition mark A and recognition mark C' come to the same position vertically, and at this state, upper and lower recognition marks A and C' may be read simultaneously and synchronously. This forcible shifting movement amount may be corrected at the time of positioning of both objects. A similar method can be employed for recognition marks B and D'.

Figure 8:
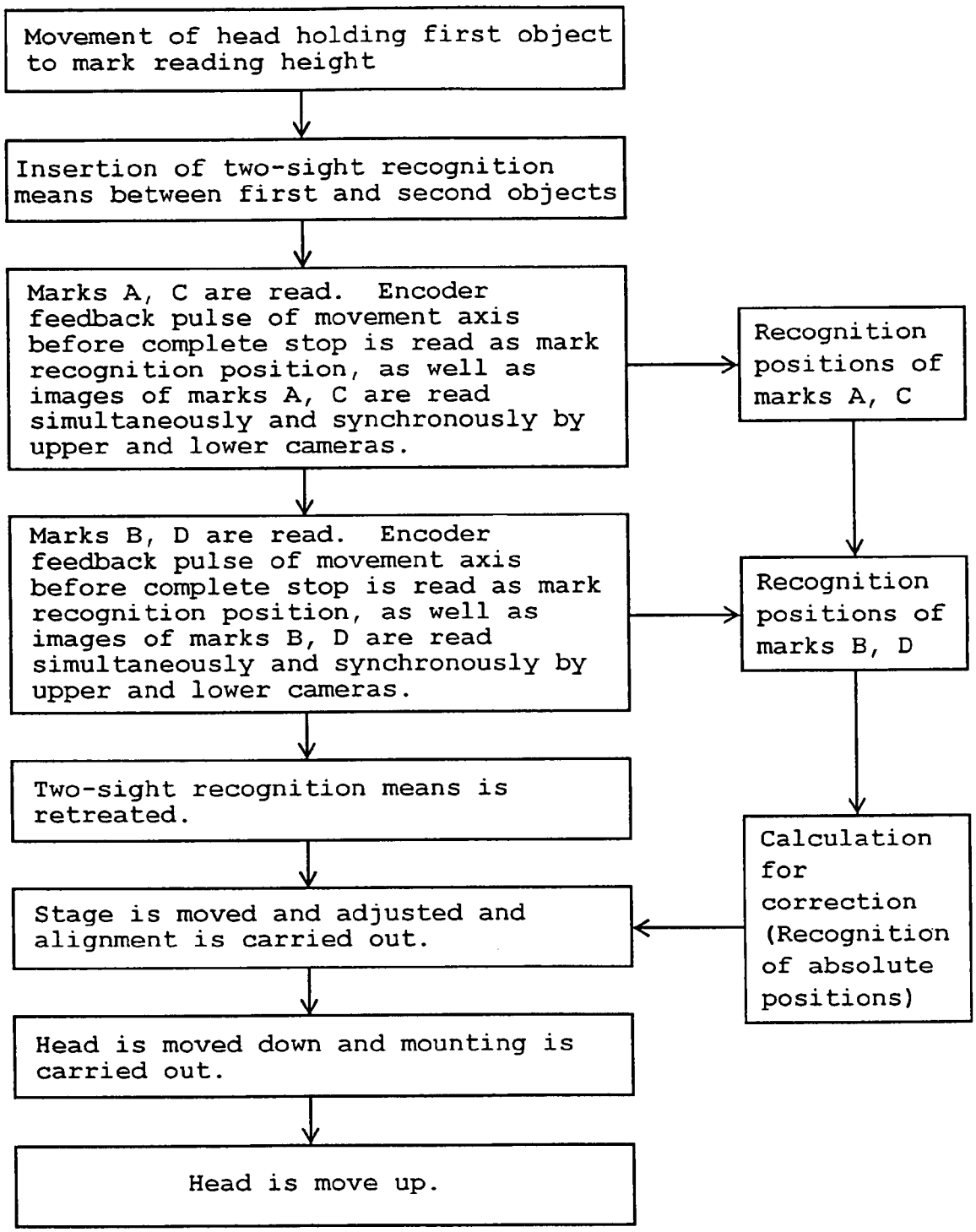
FIG. 8 is a flowchart of an operation of an alignment method according to an embodiment of the present invention.

An operation flow (an operation flow up to mounting) of a case, where upper and lower recognition marks A, C (or B, D) are read simultaneously and synchronously without forcible movement, will be exemplified in FIG. 8. Further, an operation flow (an operation flow up to mounting) of a case, where upper and lower recognition marks A, C' (or B, D') are read simultaneously and synchronously with forcible movement, will be exemplified in FIG. 9. In flows shown in FIGS. 8 and 9, a feedback pulse from a linear scale (an encoder) provided in a movement mechanism (a drive mechanism) is used for recognition of a movement axis coordinate of a two-sight recognition means.

In the flow shown in FIG. 8, a head holding a first object (for example, a chip) is moved to a position of a height for reading a recognition mark, and a two-sight recognition means is inserted between the first object and a second object (for example, a substrate). During movement of the two-sight recognition means, an encoder feedback pulse of a movement axis before complete stop is read as a mark recognition position, as well as images of recognition marks A, C are read simultaneously and synchronously by upper and lower cameras of the two-sight recognition means. Further, it is preferred that the feedback pulse is read by a linear scale provided on a table instead of an encoder, because the position can be precisely recognized without being affected by an influence from the encoder such as a backlash between it and the table or a thermal expansion.

The two-sight recognition means is moved to a next recognition position, and similarly, during movement of the two-sight recognition means, an encoder feedback pulse of a movement axis before complete stop is read as a mark recognition position, as well as images of recognition marks B, D are read simultaneously and synchronously by upper and lower cameras of the two-sight recognition means.

Although the two-sight recognition means is retreated after reading of the mark images, the above-described recognition positions of marks A, C and marks B, D are corrected based on the feedback information of the movement axis at the time of the above-described image reading, and the absolute positions of the recognition marks A, C and the recognition marks B, D are recognized.

Base on this recognition information of the absolute positions, the stage is moved and adjusted, and the alignment is carried out so that the relative positional relationship between both objects is controlled within a predetermined range in accuracy. After positioning, the head is moved down, and the mounting of the first object onto the second object is carried out. After mounting, the head is moved up, and a series of mounting operations are completed.

Figure 9:
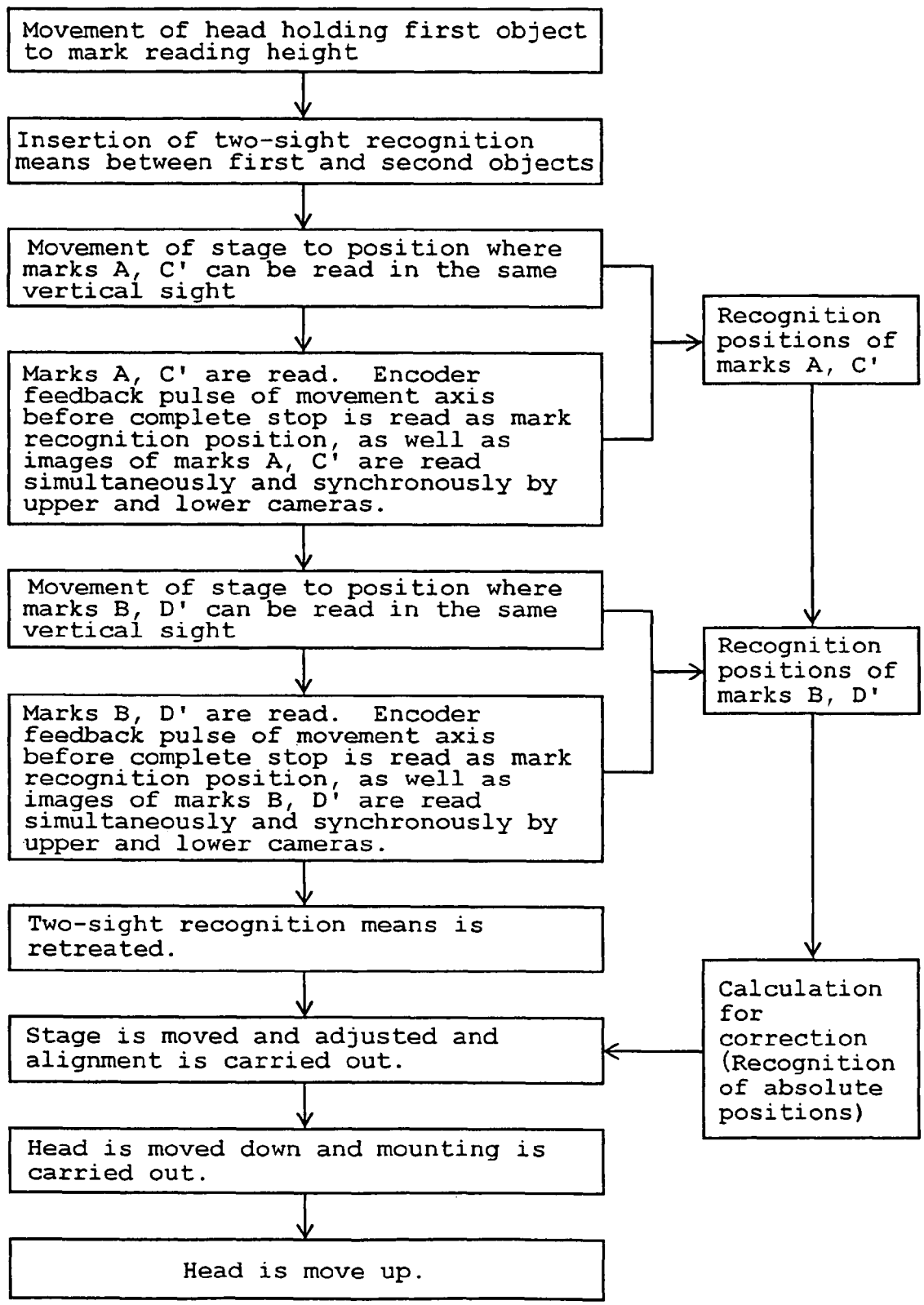
FIG. 9 is a flowchart of an operation of an alignment method according to another embodiment of the present invention.

In the flow shown in FIG. 9, a head holding a first object (for example, a chip) is moved to a position of a height for reading a recognition mark, and a two-sight recognition means is inserted between the first object and a second object (for example, a substrate). A stage is moved so that a recognition mark C' can be read within the same vertical sight as that for a recognition mark A. After movement of the mark, during movement of the two-sight recognition means, an encoder feedback pulse of a movement axis before complete stop is read as a mark recognition position, as well as images of recognition marks A, C' are read simultaneously and synchronously by upper and lower cameras of the two-sight recognition means. Even in this case, in a case where the complete stop of the stage side is difficult relative to the camera movement time, it is preferred to also read a feedback pulse of an encoder on a table of the stage side. Further, a linear scale is preferable to the encoder.

Figure 10:
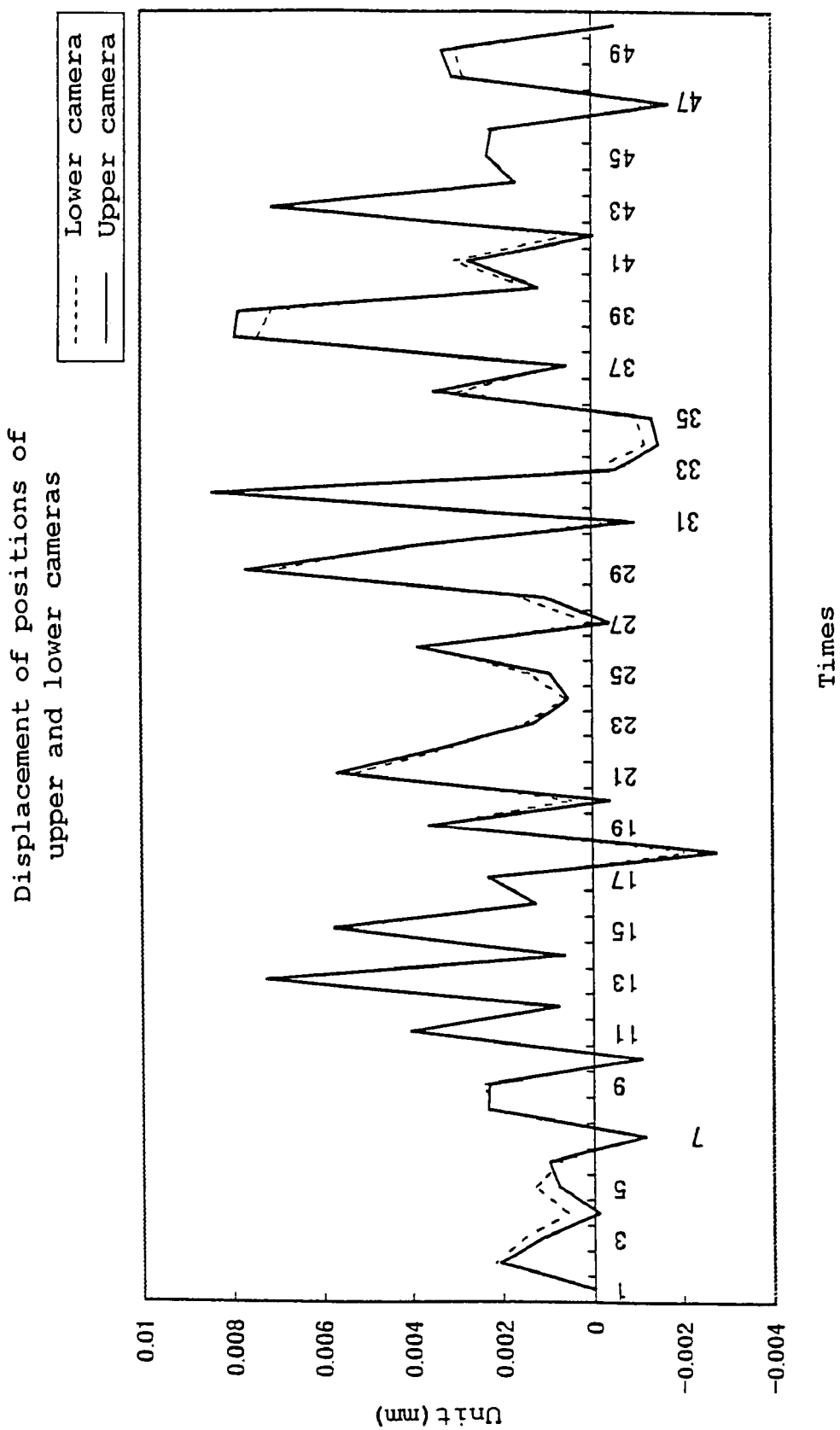
FIG. 10 is a graph showing a measurement result in a case where upper and lower recognition marks are repeatedly read simultaneously and synchronously by upper and lower cameras during movement of a two-sight recognition means.
Figure 11:
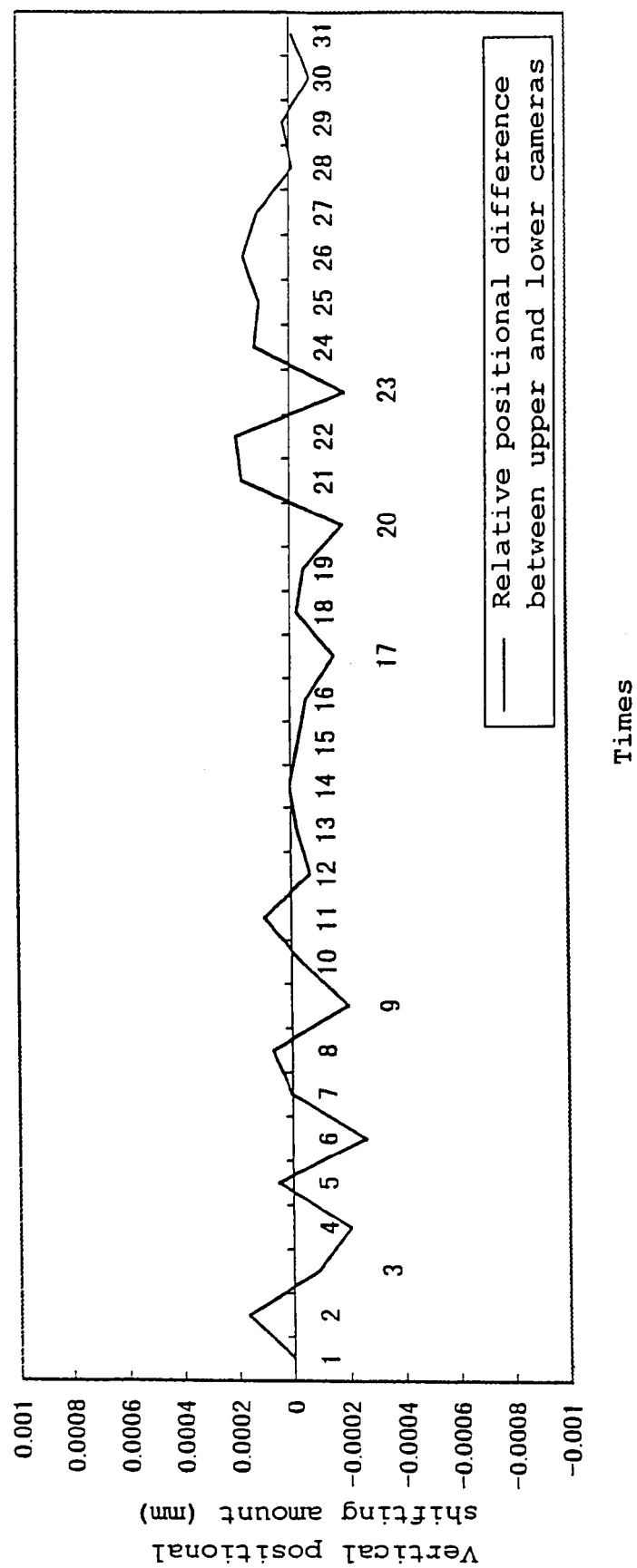
FIG. 11 is a graph showing a result of relative positions of upper and lower recognition marks by the present invention in the property depicted in FIG. 10.

Data examples in the above-described case where recognition marks A, C are read simultaneously and synchronously by the upper and lower cameras are shown in FIGS. 10 and 11. FIG. 10 shows data of image reading positions relative to a reference position in a case where the operation for reading images of recognition marks A, C' simultaneously and synchronously by upper and lower cameras during movement of a two-sight recognition means is repeated. As shown in FIG. 10, even if the measurement was repeated by the same coordinate, the image reading position of a single body of upper camera A or lower camera C' was not stable during the movement of the two-sight recognition means, and a dispersion of about 8 μm occurred. Namely, when mounting is carried out at this condition, a dispersion of about 8 μm occurs. However, in a case where an alignment is carried out by reading the images of recognition marks A, C' simultaneously and synchronously by upper and lower cameras, the relative positions of the recognition marks A, C' exhibit as shown in FIG. 11, it becomes possible to detect the relative errors to be about 0.6 μm or less, and it is understood that the accuracy can be greatly increased. Further, by reading the encoder feedback pulse, this dispersion of about 8 μm can be recognized as an absolute position and can be cancelled. Therefore, even when an alignment accompanying θ correction, which requires an absolute position of a rotational center, is carried out, its accuracy can be assured.

Further, the stage is moved so that it can read recognition mark B and recognition mark D' in the same vertical sight, and the two-sight recognition means is moved to a next recognition position. Then, similarly to the above-described operation, during movement of the two-sight recognition means, an encoder feedback pulse of a movement axis before complete stop is read as a mark recognition position, as well as images of recognition marks B, D' are read simultaneously and synchronously by upper and lower cameras of the two-sight recognition means.

Although the two-sight recognition means is retreated after reading the mark images, the recognition positions of marks A, C' and the recognition positions of marks B, D' are calculated and corrected based on the feedback information of the movement axis at the time of the above-described image reading, and absolute positions of the recognition marks A, C' and the recognition marks B, D' are recognized.

The stage is moved and adjusted based on this recognition information of the absolute positions, and the alignment is carried out so that the relative positional relationship between both objects is controlled within a predetermined range in accuracy. After positioning, the head is moved down, and the mounting of the first object onto the second object is carried out. After mounting, the head is moved up, and a series of the mounting operations are completed.

Even in any operation shown in FIGS. 8 and 9, because it is not necessary to set a settling time for complete stop by reading mark images during the movement of the recognition means, the alignment time and the mounting tact can be greatly shortened. Further, because the absolute positions of the recognition marks can be precisely recognized by the correction based on the feedback information of the movement axis at the time of image reading, a high accuracy for the alignment can be assured at the same time.

Figure 3:
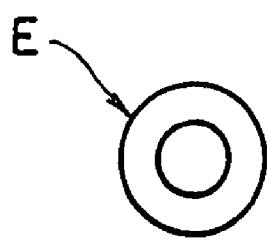
FIG. 3 is a plan view of each of recognition marks, showing a case where a mark may be recognized at a condition of being enlarged when the mark is recognized by a movable recognition means during its movement.
Figure 3:
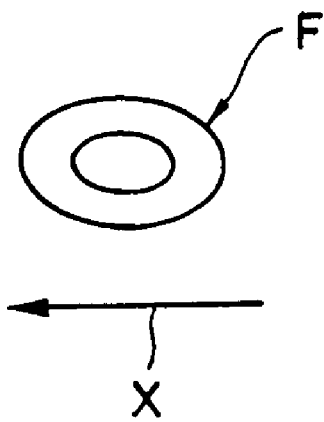
Figure 4:
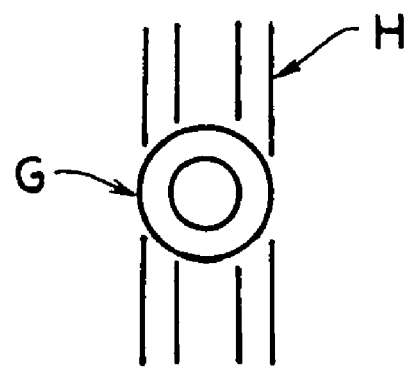
FIG. 4 is a plan view of a recognition mark showing smear phenomenon.

Further, as aforementioned, if an exposure time is shortened by using an electronic shutter when reading the recognition marks, an enlargement phenomenon of read mark as shown in FIG. 3 can be prevented, and even when a strong light source is used in order to further shorten the exposure time, if a stroboscopic emission is carried out synchronously with the exposure, it becomes possible to suppress smear phenomenon as shown in FIG. 4 to as little as possible, and an even higher accuracy of position recognition can be achieved.

Figure 12:
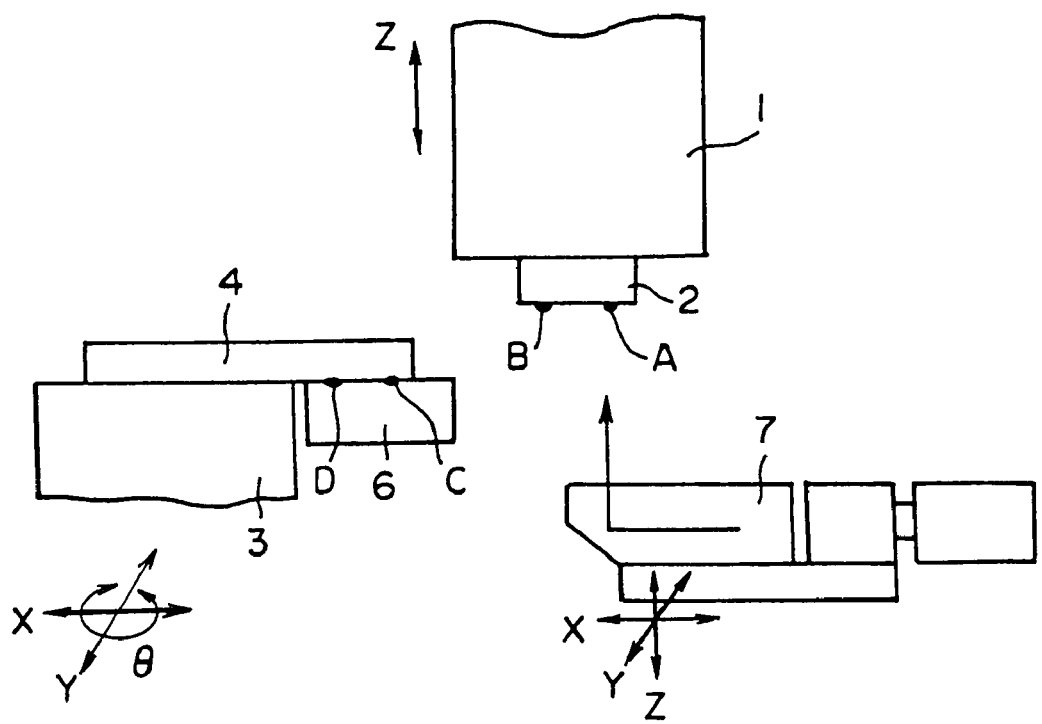
FIG. 12 is a schematic view of a mounting apparatus to which an alignment method according to a further embodiment of the present invention can be applied.
Figure 13:
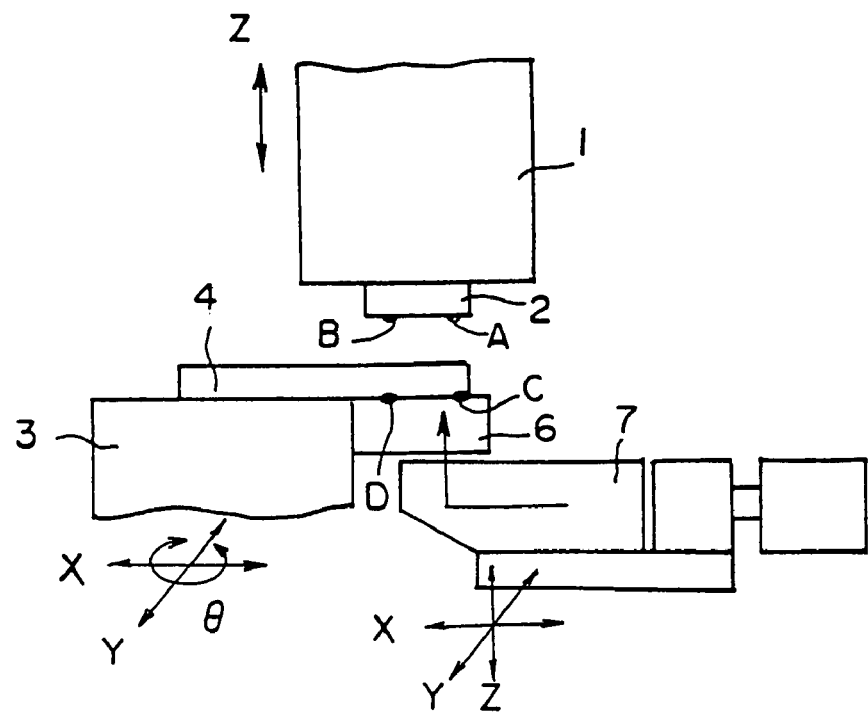
FIG. 13 is a schematic view of the mounting apparatus showing a next operation of the operation depicted in FIG. 12.

As such efficient alignment method and mounting method using the alignment method according to the present invention capable of carrying out at a high accuracy and for a short period of time, other embodiments can be employed. For example, FIGS. 12 and 13 show a mounting apparatus to which an alignment method according to a further embodiment of the present invention is applied. In FIG. 12, positioning recognition marks A, B are provided on the lower surface of a first object 2 (for example, a chip) held by head 1, and positioning recognition marks C, D are provided on the lower surface of a second object 4 (for example, a substrate) held by stage 3. The portion of the second object 4, which protrudes from stage 3, is supported by a receiving member 6, and recognition marks C, D are provided on the lower surface of this protruded portion. Although the receiving member 6 is formed from a glass capable of transmitting a measurement wave, it may be formed from a material capable of transmitting a measurement wave such as an infrared ray or an X ray except glass. A recognition means 7 is provided at a position below both objects 2 and 4 so as to be able to be moved and controlled in position. In this embodiment, the recognition means 7 comprises a single-sight recognition means having only an upward sight. Further, head 1 is provided so as to be able to be moved in a vertical direction (Z direction), stage 3 is provided so as to be able to be moved in a horizontal direction (X, Y directions) and a rotational direction (θ direction), and recognition means 7 is provided so as to be able to be moved in X, Y and Z directions, respectively.

In the mounting apparatus thus constructed, the alignment and the mounting are carried out, for example, in order of the following steps.

(1) As shown in FIG. 12, recognition means 7 is moved to a position below first object 2 held by head 1, particularly, to a position at which recognition mark A enters into the sight from the lower side.
(2) Recognition mark A of the first object 2 side is read.
(3) Recognition mark B of the first object 2 side is read by moving recognition means 7.
(4) As shown in FIG. 13, in order to recognize second object 4, stage 3 is moved and recognition means 7 is moved to a position at which recognition mark C enters into the sight from the lower side.
(5) Recognition mark C of the second object 4 side is read.
(6) Recognition mark D of the second object 4 side is read by moving recognition means 7.
(7) A correction processing is carried out from the result of reading the marks A, B, C and D.
(8) The position and posture of stage 3 are adjusted, and the relative positional accuracy between both objects 2 and 4 is controlled within a predetermined range.
(9) Head 1 is moved down and the mounting is carried out, and after mounting, head 1 is moved up.

The order of these operation steps may be changed arbitrarily in the above-described steps (1) to (6).

Figure 14:
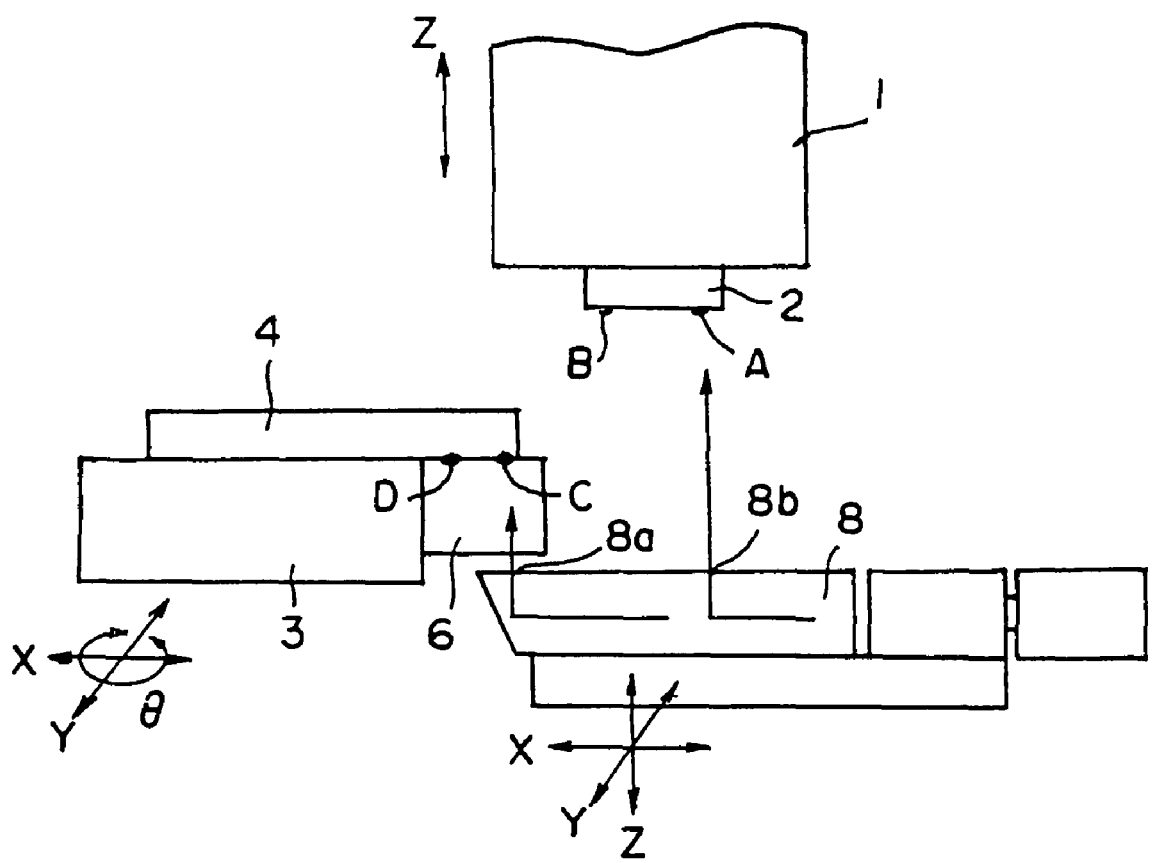
FIG. 14 is a schematic view of a mounting apparatus to which an alignment method according to a still further embodiment of the present invention can be applied.

FIG. 14 shows a mounting apparatus to which an alignment method according to a still further embodiment of the present invention is applied. In the apparatus shown in FIG. 14, similarly to that shown in FIG. 12, positioning recognition marks A, B are provided on the lower surface of a first object 2 (for example, a chip) held by head 1, and positioning recognition marks C, D are provided on the lower surface of a second object 4 (for example, a substrate) held by stage 3 and receiving member 6. A recognition means 8 comprising a double lens camera, which has two lenses 8a and 8b, is provided at a position below both objects 2 and 4 so as to be able to be moved and controlled in position, and this double lens camera is incorporated integrally into the recognition means 8 capable of being controlled in position, namely, into a movement mechanism, at a condition of a fixed predetermined relative positional relationship.

In the mounting apparatus thus constructed, the alignment and the mounting are carried out, for example, in order of the following steps.

(1) Recognition means 8 comprising a double lens camera is moved to a position below first object 2 held by head 1, particularly, to a position at which recognition mark A enters into the sight from the lower side.
(2) Recognition mark A of the first object 2 side and recognition mark C of the second object 4 side are read simultaneously.
(3) Recognition mark B of the first object 2 side and recognition mark D of the second object 4 side are read simultaneously by moving recognition means 8 (also moving stage 3 in accordance with the positional relationship between recognition marks).
(4) A correction processing is carried out from the result of reading the marks A, B, C and D.
(5) The position and posture of stage 3 are adjusted, and the relative positional accuracy between both objects 2 and 4 is controlled within a predetermined range.
(6) Head 1 is moved down and the mounting is carried out, and after mounting, head 1 is moved up.

The above-described step (2) may be changed with the step (3).

Figure 15:
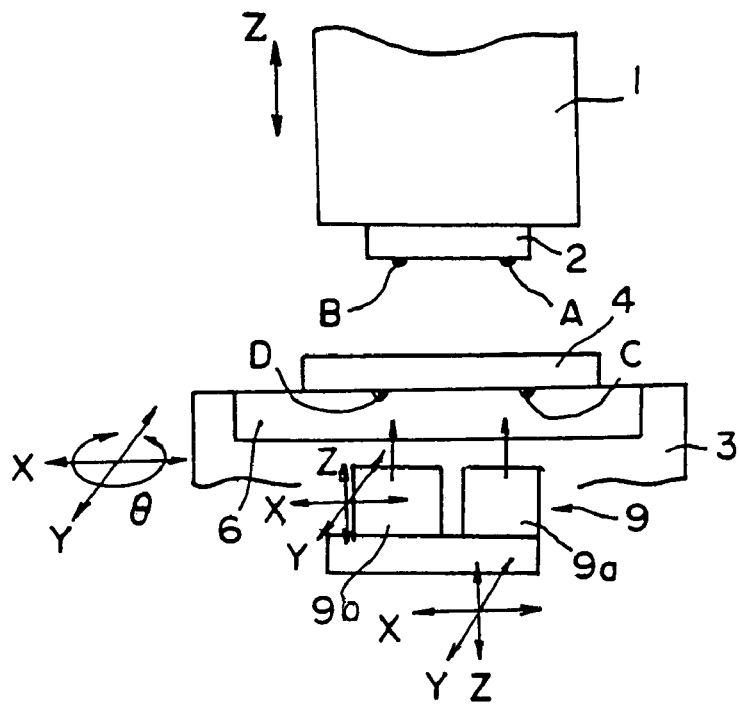
FIG. 15 is a schematic elevational view of a mounting apparatus to which an alignment method according to a still further embodiment of the present invention can be applied.
Figure 16:
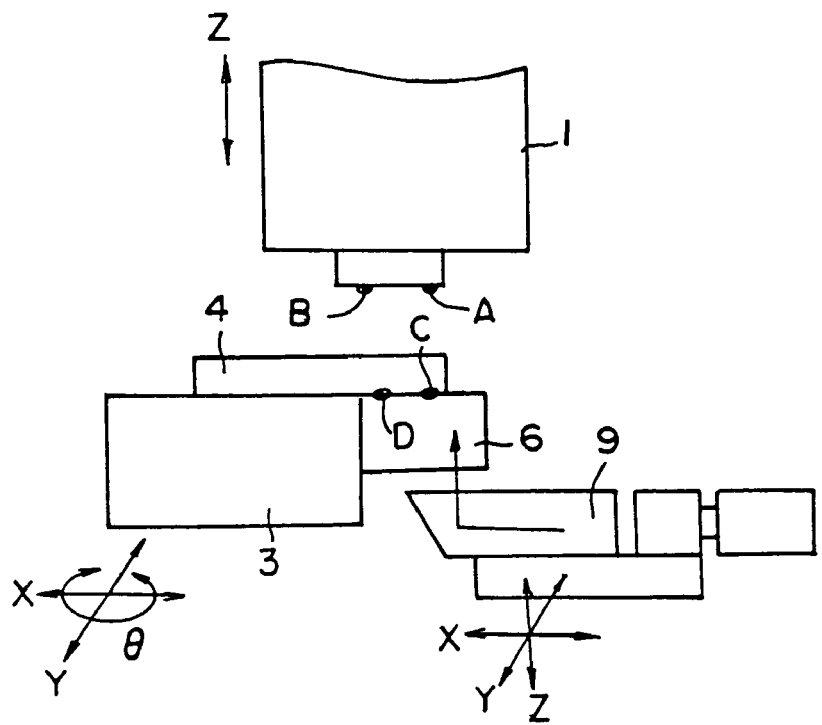
FIG. 16 is a schematic side view of the mounting apparatus depicted in FIG. 15.

FIGS. 15 and 16 show a mounting apparatus to which an alignment method according to a still further embodiment of the present invention is applied. In the apparatus shown in FIGS. 15 and 16, similarly to that shown in FIG. 12, positioning recognition marks A, B are provided on the lower surface of a first object 2 (for example, a chip) held by head 1, and positioning recognition marks C, D are provided on the lower surface of a second object 4 (for example, a substrate) held by stage 3 and receiving member 6. A recognition means 9 constructed as a double lens camera by incorporating two cameras 9a and 9b separable from each other into a movement mechanism is provided at a position below both objects 2 and 4 so as to be able to be moved and controlled in position.

In the mounting apparatus thus constructed, the alignment and the mounting are carried out, for example, in order of the following steps.

(1) Recognition means 9 comprising a double lens camera of a two camera separate type is moved to a position below first object 2 held by head 1, particularly, to a position at which recognition mark A enters into the sight from the lower side.
(2) Recognition mark A and recognition mark B of the first object 2 side are read simultaneously.
(3) In order to recognize second object 4, stage 3 is moved, and recognition means 9 is moved to a position at which recognition mark C of the second object 4 side enters into the sight from the lower side.
(4) Recognition mark C and recognition mark D of the second object 4 side are read simultaneously. However, in a case where the relative positional relationship between recognition marks A and B of the first object 2 side is different from the relative positional relationship between recognition marks C and D of the second object 2 side, the reading is carried out after one camera in recognition means 9 is moved.

(5) A correction processing is carried out from the result of reading the marks A, B, C and D.
(6) The position and posture of stage 3 are adjusted, and the relative positional accuracy between both objects 2 and 4 is controlled within a predetermined range.
(7) Head 1 is moved down and the mounting is carried out, and after mounting, head 1 is moved up.

The above-described step (2) may be changed with the step (3).

Thus, for the alignment method and the mounting method using the alignment method according to the present invention, various embodiments can be employed. In the alignment method and the mounting method using the alignment method according to the present invention, by reading upper and lower alignment marks simultaneously, the accuracy increases as compared with that in a conventional technology, it is not necessary to assure a settling time for complete stop of a movable recognition means, and the alignment time and the mounting tact can be greatly shortened. Further, if an electronic shutter and a stroboscope are used at the time of reading a recognition mark, an even higher accuracy for recognition of positions can be achieved.

The alignment method and the mounting method using the alignment method according to the present invention can be applied to any positioning between objects to be bonded and any mounting of positioned objects. By applying the present invention, a high-accuracy mounting becomes possible, and an alignment time and a mounting tact can be greatly shortened.

What is claimed is:

1. An alignment method for positioning objects to be bonded to each other by reading positioning recognition marks provided on both objects by a two-sight recognition device having sights in directions toward both objects, said alignment method comprising the steps of:
   moving the two-sight recognition device; and
   reading both of said recognition marks simultaneously and synchronously during said step of moving the two-sight recognition device;
   wherein said step of moving the two-sight recognition device includes using a double lens camera positioned at a lower side of both objects.

2. The alignment method according to claim 1, wherein said step of moving includes using the two-sight recognition device having sights in directions toward both objects positioned at upper and lower sides.

3. The alignment method according to claim 1, wherein said step of using the double lens camera includes integrally incorporating a movement mechanism.

4. The alignment method according to claim 1, wherein said step of using the double lens camera includes incorporating two cameras which are separable into a movement mechanism.

5. The alignment method according to claim 1, further comprising the steps of:
   moving a recognition mark provided on one object together with the object to a position at which the recognition mark can be read simultaneously with a recognition mark provided on the other object when recognition marks of both objects are previously provided at positions impossible to read simultaneously, and after the step of reading both recognition marks simultaneously and synchronously, identifying an absolute position of the moved recognition mark by correction in consideration of an amount of the movement.

6. The alignment method according to claim 5, wherein said step of moving the recognition mark includes moving said one object to a recognition position prior to said two-sight recognition device.

7. The alignment method according to claim 5, wherein said step of moving the recognition mark includes moving said one object to a recognition position simultaneously with said two-sight recognition device.

8. The alignment method according to claim 5, wherein said step of moving the recognition mark includes identifying an absolute position of said recognition mark of said one object before a complete stop of a table for moving said one object, based on a position feedback signal of the table.

9. The alignment method according to claim 8, wherein said step of reading both of the recognition marks includes controlling an exposure time by an electronic shutter.

10. The alignment method according to claim 9, wherein said step of controlling includes carrying out a stroboscopic emission synchronously with the exposure time due to the electronic shutter.

11. A mounting method for mounting one object onto the other object to be bonded to each other after positioning both objects to each other by using an alignment method, said alignment method positioning both objects to each other by reading positioning recognition marks provided on both objects by a two-sight recognition device having sights in directions toward both objects, said alignment method comprising the steps of:
    moving the two-sight recognition device; and
    reading both of said recognition marks simultaneously and synchronously during said step of moving the two-sight recognition device;
    wherein said step of moving the two-sight recognition device includes using a double lens camera positioned at a lower side of both objects.

12. The mounting method according to claim 11, wherein said step of moving includes using the two-sight recognition device having sights in directions toward both objects positioned at upper and lower sides.

13. The mounting method according to claim 11, wherein said step of using the double lens camera includes integrally incorporating a movement mechanism.

14. The mounting method according to claim 11, wherein said step of using the double lens camera includes incorporating two cameras which are separable into a movement mechanism.

15. The mounting method according to claim 11, further comprising the steps of:
    moving a recognition mark provided on one object is moved together with the object to a position at which the recognition mark can be read simultaneously with a recognition mark provided on the other object when recognition marks of both objects are previously provided at positions impossible to read simultaneously, and after the step of reading both recognition marks simultaneously and synchronously, identifying an absolute position of the moved recognition mark by correction in consideration of an amount of the movement.

16. The mounting method according to claim 15, wherein said step of moving the recognition mark includes moving said one object to a recognition position prior to said two-sight recognition device.

17. The mounting method according to claim 15, wherein said step of moving the recognition mark includes moving said one object to a recognition position simultaneously with said two-sight recognition device.

18. The mounting method according to claim 15, wherein said step of moving the recognition mark includes identifying an absolute position of said recognition mark of said one object before a complete stop of a table for moving said one object, based on a position feedback signal of the table.

19. The mounting method according to claim 18, wherein said step of reading both of the recognition marks includes controlling an exposure time by an electronic shutter.

20. The mounting method according to claim 19, wherein said step of controlling includes carrying out a stroboscopic emission synchronously with the exposure time due to the electronic shutter.

* * * * *